United States Patent
Cheng et al.

(10) Patent No.: US 8,851,154 B2
(45) Date of Patent: Oct. 7, 2014

(54) COOLING MODULE AND SYSTEM FOR LAMP DEVICE

(75) Inventors: Kai-An Cheng, Taoyuan County (TW); Chia-Chen Liao, Taoyuan County (TW); Chun-Hsien Wu, Taoyuan County (TW); Hsien-Chun Meng, Taoyuan County (TW); Hsien Meng, Taoyuan County (TW)

(73) Assignee: MicroBase Technology Corp., Taoyuan County (TW)

( * ) Notice: Subject to any disclaimer, the term of this patent is extended or adjusted under 35 U.S.C. 154(b) by 696 days.

(21) Appl. No.: 13/193,967

(22) Filed: Jul. 29, 2011

(65) Prior Publication Data

US 2012/0026745 A1 Feb. 2, 2012

(30) Foreign Application Priority Data

Jul. 30, 2010 (TW) ................ 99125345 A

(51) Int. Cl.
*F28D 15/02* (2006.01)
*F21V 29/00* (2006.01)
*F21S 8/10* (2006.01)
*H01L 23/473* (2006.01)
*H01L 23/427* (2006.01)

(52) U.S. Cl.
CPC ............ *H01L 23/4735* (2013.01); *F21V 29/30* (2013.01); *F21S 48/328* (2013.01); *H01L 23/427* (2013.01); *F21V 29/006* (2013.01)
USPC ............ 165/104.21; 165/104.22; 165/104.28; 165/104.32; 165/104.33; 165/80.4; 62/118; 62/259.2; 362/373; 362/294

(58) Field of Classification Search
USPC ............. 165/104.19, 104.21, 104.22, 104.26, 165/104.27, 104.28, 104.32, 104.33, 80.4; 62/259.2, 118; 362/294
See application file for complete search history.

*Primary Examiner* — Ismael Negron
(74) *Attorney, Agent, or Firm* — Hammer & Associates, P.C.

(57) ABSTRACT

A cooling module includes a casing with a thermal-transmittance wall having an interior surface and an exterior surface, a coolant inlet, a vapor outlet, and a converting component with a plurality of orifices and dividing an interior of the casing into a coolant chamber and a vaporization chamber. A liquid coolant is ejected through the plurality of orifices to form plumes toward the interior surface of the thermal-transmittance wall and exchange heat with the thermal-transmittance wall resulting in coolant vapor. In a cooling system, a vapor conduit then carries the vapor to a condenser, and a coolant conduit returns the condensed coolant to the cooling module. The cooling system is used to cool a lamp device.

19 Claims, 8 Drawing Sheets

COOLING MODULE AND SYSTEM FOR LAMP DEVICE

CROSS-REFERENCE TO RELATED APPLICATION

This application claims priority of Taiwanese Application No. 099125345, filed on Jul. 30, 2010, the disclosures of which is incorporated herein by reference.

BACKGROUND OF THE INVENTION

1. Field of the Invention

The invention relates to a cooling system, more particularly to a cooling system that is able to employ phase transition principle to cool high-power electronic elements that are not disposed horizontally.

2. Description of the Related Art

A cooling technique that employs the phase transition principles was developed for the increasing demand to dissipate the heat generated by high-power electronic elements. A spray cooling module, as disclosed in U.S. Pat. No. 7,082,778 B2, incorporates a plurality of inkjet-type sprayers, each including a heater for vaporizing a portion of a liquid coolant, to create enough pressure to eject an incremental amount of the liquid coolant through an orifice that directs the ejected liquid coolant toward a thermal-transmittance wall of a spray chamber. The sprayed liquid coolant absorbs heat and can vaporize once enough heat is absorbed thereby. Nevertheless, the inkjet-type sprayer has a complicated structure, and requires a heater that undesirably generates more heat to heat up the liquid coolant, resulting in reduced efficiency.

In addition, the module is working under the assumption that the electronic element is disposed horizontally, such that the sprayers are facing downward, and the movement of the sprayed liquid coolant is also directed by gravity. If the electronic element is oriented vertically, the trajectory of the sprayed liquid coolant will be affected by gravity, thereby creating a downward vertical displacement and making more of the liquid coolant arrive at the bottom part of the thermal-transmittance wall. This results in an uneven heat dissipating effect.

SUMMARY OF THE INVENTION

Therefore, an object of the present invention is to provide a lamp device with a cooling system that utilizes phase transition principles to cool the device.

Another object of the present invention is to provide a cooling system with a relatively simple structure and high cooling efficiency, especially to cool high-power electronic elements that are not disposed horizontally.

Still another object of the present invention is to provide a cooling module able to cool high-power electronic elements that are not disposed horizontally.

Accordingly, a lamp device of the present invention includes a lamp housing, a light emitting component that is disposed in the lamp housing and that serves as a heat source, and a cooling system disposed in the lamp housing for cooling the light emitting component. The cooling system includes a liquid coolant, a cooling module for use with the liquid coolant to cool the heat source, a condenser, a vapor conduit, and a coolant conduit.

The cooling module includes a casing and a converting component. The casing has a thermal-transmittance wall, a coolant inlet and a vapor outlet. The thermal-transmittance wall has an interior surface and an exterior surface disposed in heat conductive contact with the heat source. The converting component is disposed in the casing and divides an interior of the casing into a coolant chamber and a vaporization chamber. The coolant chamber is in fluid communication with the coolant inlet for receiving the liquid coolant therein. The vaporization chamber is adjacent to the thermal-transmittance wall and is in fluid communication with the vapor outlet. The converting component is formed with a plurality of orifices for permitting the liquid coolant in the coolant chamber to be elected therethrough to form plumes of the liquid coolant that travel toward the interior surface of the thermal-transmittance wall and that exchange heat with the thermal-transmittance wall to result in coolant vapor flowing out of the vaporization chamber via the vapor outlet. The converting component is formed with a plurality of orifices, has a top edge and a bottom edge, and forms an angle relative to the thermal-transmittance wall such that a distance between the top edge of the converting component and the interior surface of the thermal-transmittance wall is not greater than a distance between the bottom edge of the converting component and the interior surface of the thermal-transmittance wall.

The condenser has a fluid inlet and a fluid outlet. The vapor conduit connects fluidly the vapor outlet of the cooling module to the fluid inlet of the condenser to permit flow of the coolant vapor from the vaporization chamber to the condenser. The coolant conduit connects fluidly the fluid outlet of the condenser to the coolant inlet of the cooling module to permit flow of the liquid coolant in the condenser to the coolant chamber. The cooling module, the condenser, the vapor conduit and the coolant conduit cooperate to form a closed circulation loop.

Preferably, the light emitting component is disposed at an angle ($\beta$) greater than 0 degree and not greater than 90 degrees with respect to a horizontal plane, more preferably between 10 to 60 degrees, and more preferably between 15 to 45 degrees.

Preferably, the converting component has a top edge and a bottom edge, and forms an angle ($\alpha$) that is greater than 0 degree and not greater than 10 degrees relative to said thermal-transmittance wall.

Preferably, the casing of the cooling module includes a first casing part and a second casing part. The open sides of the first sides of the first and second parts can match to form the closed casing of the cooling module. The thermal-transmittance wall forms a closed side of the first casing part. The first casing part has an open side defined by an edge that is disposed on an inclined plane. The inclined plane forms an angle ($\alpha$) with a plane of the thermal-transmittance wall. The converting component is disposed at the edge of the open side of the first casing part. Alternatively, the exterior surface of the thermal-transmittance wall is disposed on an inclined plane. The inclined plane forms an angle ($\alpha$) with the plane of the edge of the open side of the first casing part. The converting component is disposed at the edge of the open side of the first casing part.

The effect of the present invention is that, by virtue of the specific configuration of the converting component, the liquid coolant can be converted into plumes of the liquid coolant that travel toward the interior surface of the thermal-transmittance wall, and absorb heat from the heat source efficiently employing phase transition principle. Moreover, the angle that is formed by the converting component relative to the plane of the thermal-transmittance wall overcomes the uneven heat dissipating effect drawback.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
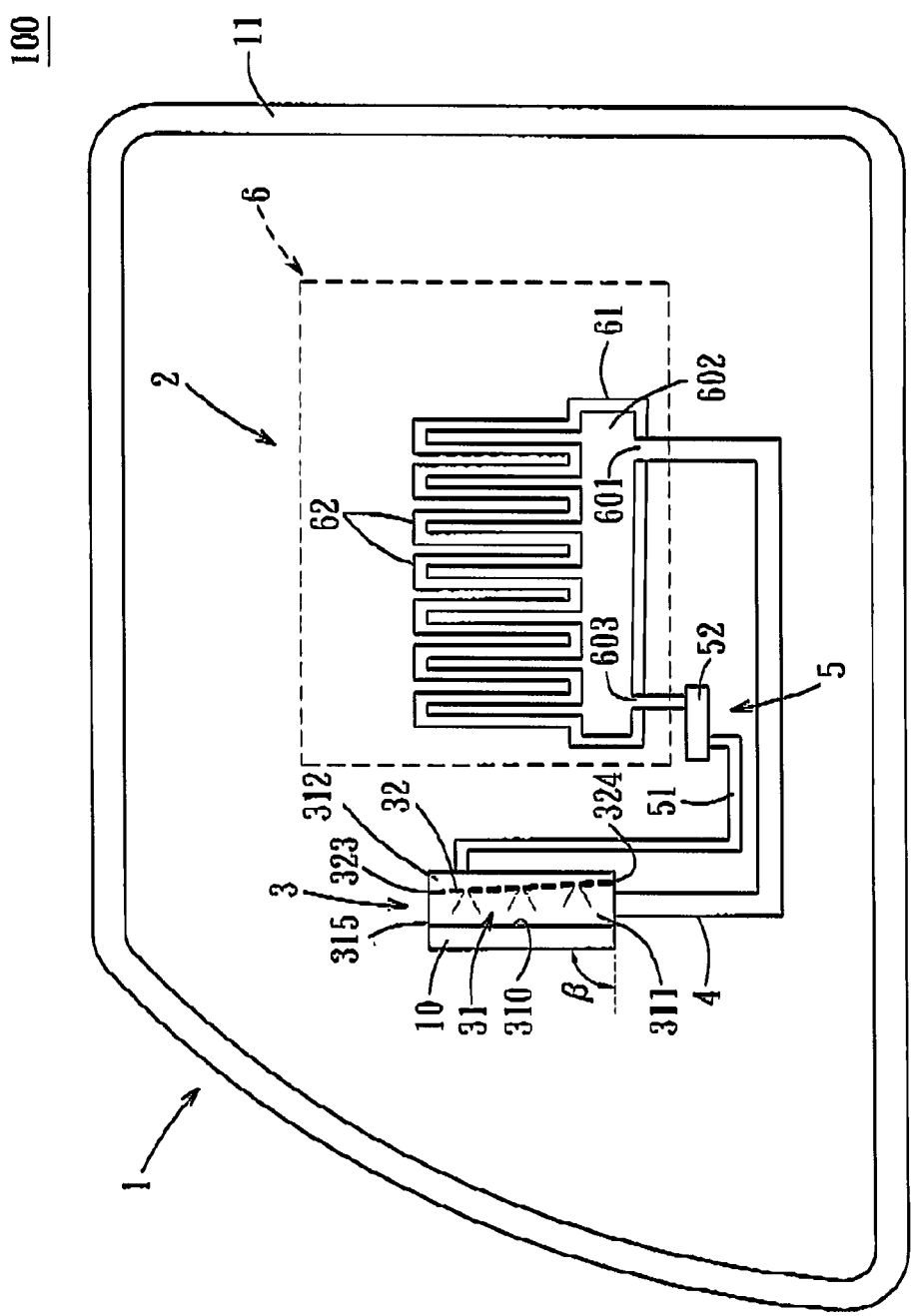
FIG. 1 is a schematic diagram of a first preferred embodiment of a lamp device according to the invention.

Before the present invention is described in greater detail, it should be noted that like elements are denoted by the same reference numerals throughout the disclosure.

FIG. 1 illustrates the first preferred embodiment of a lamp device 100 according to the present invention. The lamp device 100 can be configured as a headlamp of a vehicle, and comprises a lamp housing 11, at least one light emitting component, e.g., a light emitting diode (LED) chip disposed in the lamp housing 11, and that serves as a heat source 10, and a cooling system 2 disposed in the lamp housing 11 for cooling the heat source 10.

Figure 6:
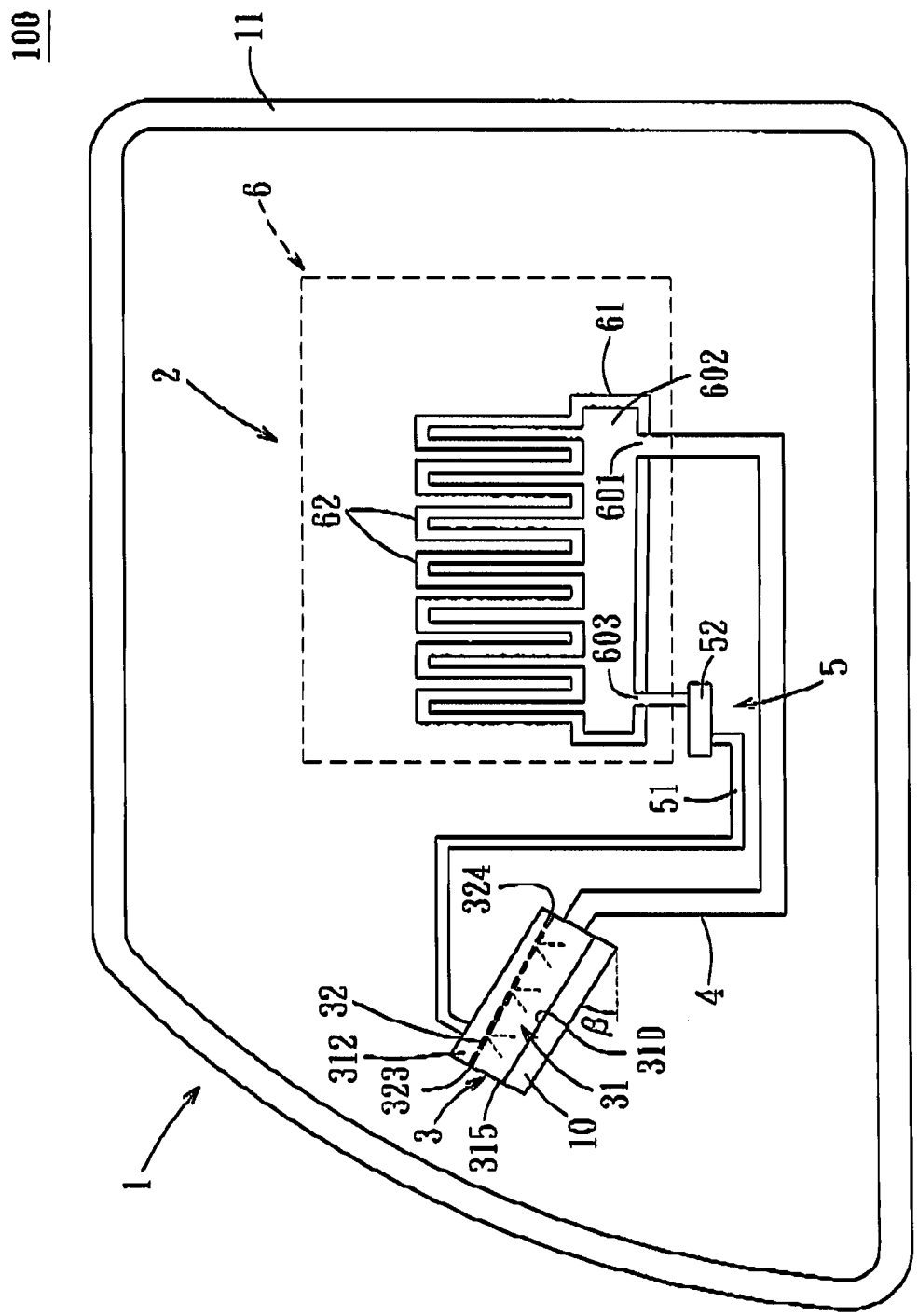
FIG. 6 is a schematic diagram of the first preferred embodiment illustrating a case where an angle β is 30 degrees.

The light emitting component of the lamp device 100 is disposed at an angle (β) that is greater than 0 degree and not greater than 90 degrees with respect to a horizontal plane. Preferably, the angle (β) is between 10 and 60 degrees and more preferably between 15 and 45 degrees. FIG. 6 illustrates a case where β is 30 degrees.

Figure 2:
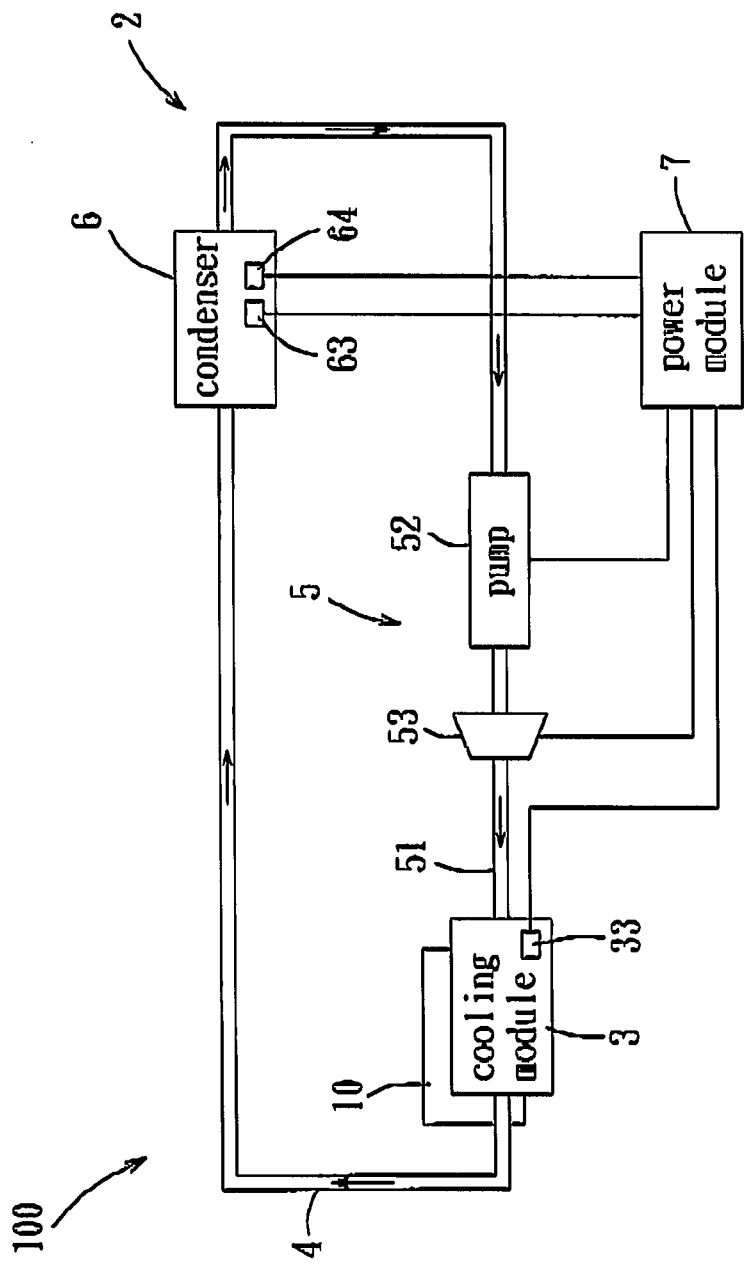
FIG. 2 is a schematic diagram of the first preferred embodiment illustrating a liquid coolant flowing in a closed circulation loop.

With reference to FIG. 2, the cooling system 2 includes a liquid coolant such as 3M® Flourinert or 3M® Novec, water, or alcohol (not limited to the disclosure), a cooling module 3 for use with the liquid coolant to cool the heat source 10, a vapor conduit 4, a coolant transferring module 5 including a coolant conduit 51, a condenser 6, and a power module 7.

The cooling module 3 includes a casing 31, a converting component 32, and a temperature sensor 33.

Figure 4:
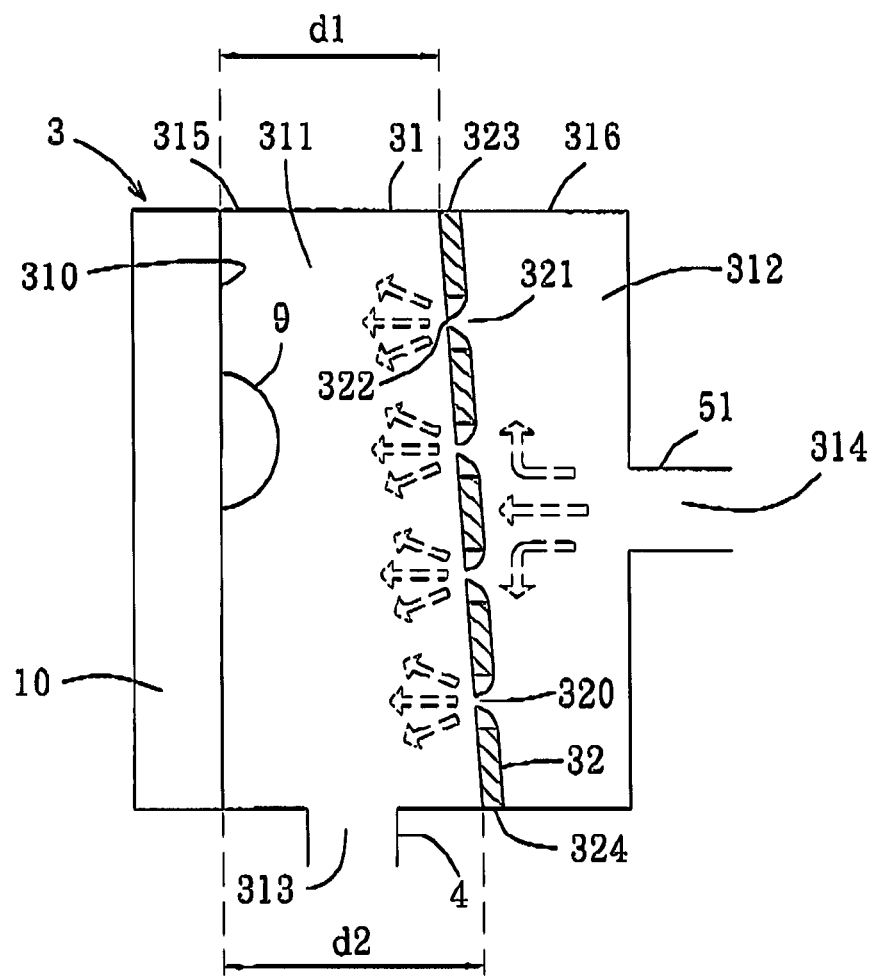
FIG. 4 is a schematic view illustrating the liquid coolant entering a cooling module of and exchanging heat with a thermal-transmittance wall according to the first preferred embodiment.

Further referring to FIG. 4, the casing 31 has a thermal-transmittance wall 310, a coolant inlet 314 and a vapor outlet 313. The thermal-transmittance wall 310 has an interior surface formed with a micro structure so as to increase the surface area such that the heat exchange between the liquid coolant and the thermal-transmittance wall 310 is accelerated, and an exterior surface disposed in heat conductive contact with the heat source 10.

The converting component 32 is disposed in the casing 31 and divides an interior of the casing 31 into a coolant chamber 312 and a vaporization chamber 311. The coolant chamber 312 is in fluid communication with the coolant inlet 314 for receiving the liquid coolant therein. The vaporization chamber 311 is adjacent to the thermal-transmittance wall 310 and is in fluid communication with the vapor outlet 313.

The converting component 32 is formed with a plurality of orifices 320 for permitting the liquid coolant in the coolant chamber 312 to be ejected therethrough plumes of the liquid coolant that travel toward the interior surface of the thermal-transmittance wall 310 and that exchange heat with the thermal-transmittance wall 310 to result in coolant vapor flowing out of the vaporization chamber 311 via the vapor outlet 313.

Referring back to FIG. 1, the condenser 6 has a fluid inlet 601 and a fluid outlet 603. The vapor conduit 4 connects fluidly the vapor outlet 313 to the fluid inlet 601 to permit flow of the coolant vapor from the vaporization chamber 311 to the condenser 6. The coolant conduit 51 connects fluidly the fluid outlet 603 to the coolant inlet 314 to permit flow of the liquid coolant from the condenser 6 to the coolant chamber 312. The cooling module 3, the condenser 6, the vapor conduit 4 and the coolant conduit 51 cooperate to form a closed circulation loop, in which the coolant flows.

Figure 3:
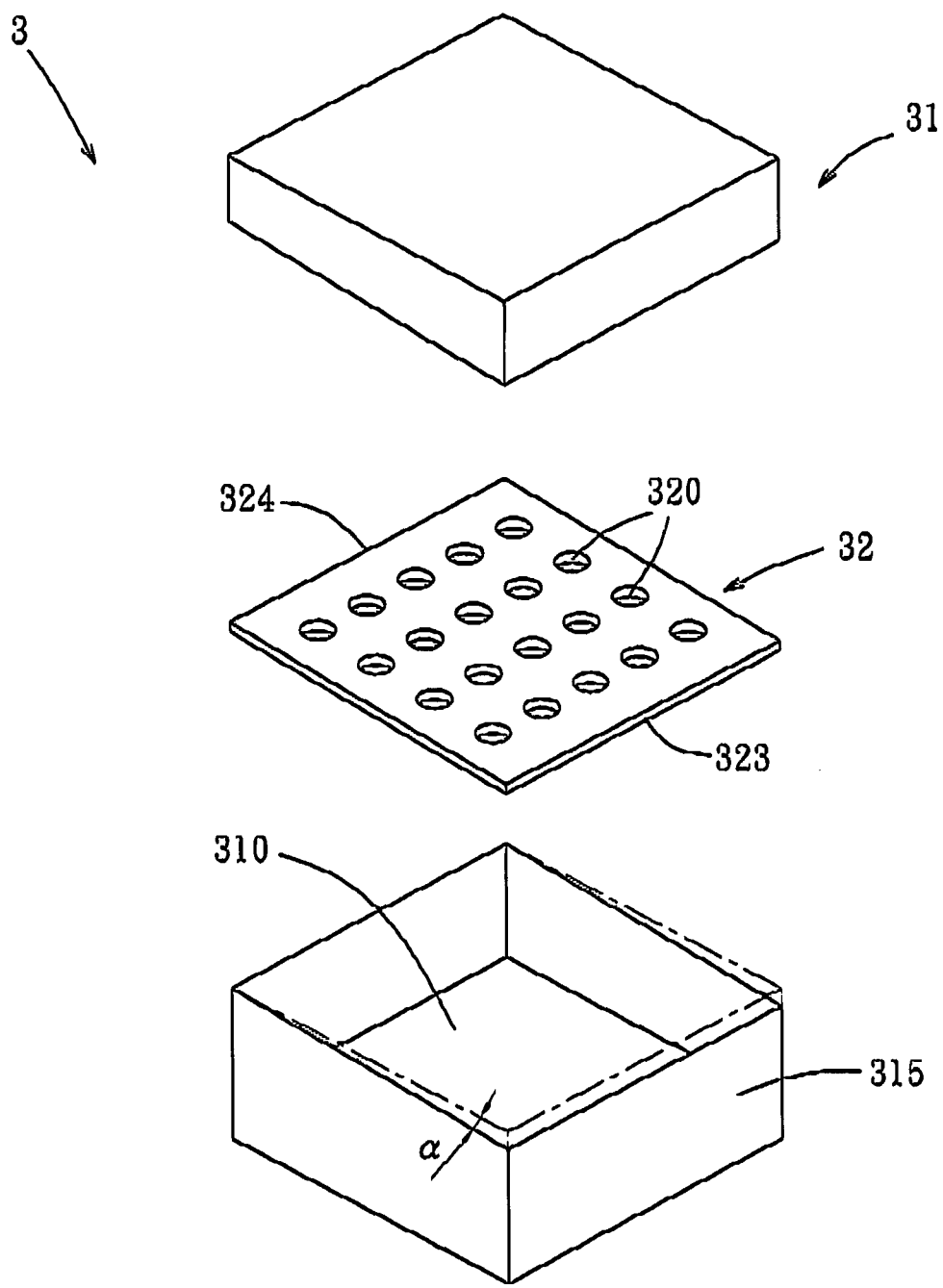
FIG. 3 is an exploded perspective view of a casing and a converting component of the first preferred embodiment.

Referring to FIG. 3, the casing 31 includes a first casing part 315, a second casing part, and the thermal-transmittance wall 310 forms a closed side of the first casing part 315. The open sides of the first sides of the first and second parts can match to form the closed casing of the cooling module. The first casing part 315 has an open side defined by an edge that is disposed on an inclined plane. The inclined plane forms an angle (α) with a plane of the thermal-transmittance wall 310, and the converting component 32 is disposed at the edge of the open side of the first casing part 315. In other words, the converting component 32 has a top edge 323 and a bottom edge 324, and forms the angle (α) relative to the plane of the thermal-transmittance wall 310 such that a distance ($d_1$) between the top edge 323 of the converting component 32 and the interior surface of the thermal-transmittance wall 310 is not greater than a distance ($d_2$) between the bottom edge 324 of the converting component 32 and the interior surface of the thermal-transmittance wall 310. Preferably, the angle (α) is greater than 0 degree and not greater than 10 degrees, the distance ($d_1$) is greater than 0 millimeter and not greater than 5 millimeters, and the distance ($d_2$) is greater than 2 millimeters and not greater than 15 millimeters.

Figure 5:
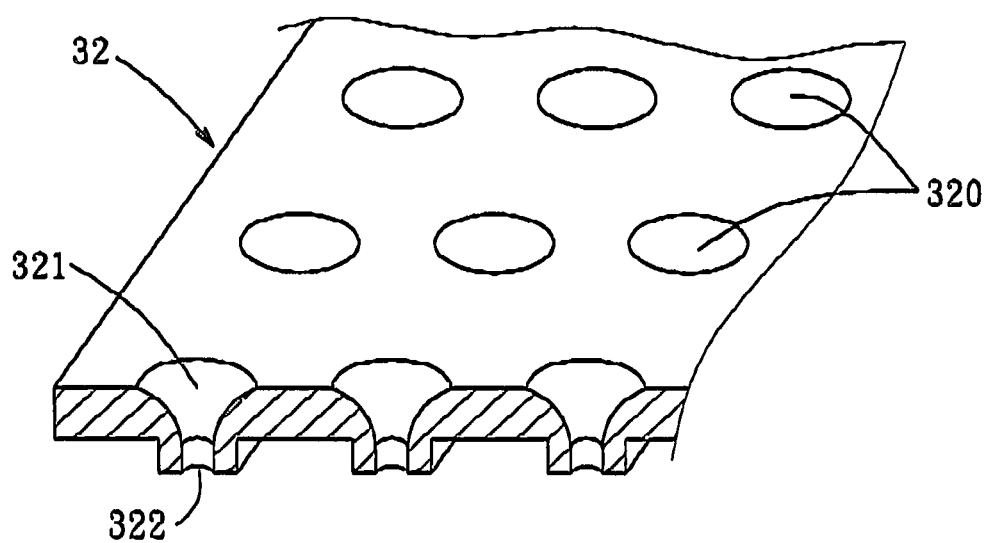
FIG. 5 is a fragmentary exploded perspective view illustrating a detailed structure of the converting component of the first preferred embodiment.

Referring to FIG. 5, in the first preferred embodiment, the converting component 32 is made by the following steps. A substrate made of a material such as glass or silicon is deposited with a metal layer by physical vapor deposition (PVD) or chemical vapor deposition (CVD). Photolithography technique is then applied to the substrate. To be specific, a photoresist layer made of negative photoresist material is disposed on the metal layer using spin coating or immersion technique. Developing and exposing procedures are then applied on the photoresist layer through a photo mask placed thereon to remove an unexposed part of the photoresist layer, thereby exposing a corresponding part of the metal layer. The exposed metal layer is removed by etching, followed by stripping the residual photoresist layer to obtain the metal layer with a plurality of holes, each of which has a hole diameter larger then a hole diameter of the orifice 320 of the converting component 32, and will form a respective one of the orifices 320. Electroforming technique is then carried out on the metal layer on the substrate, thereby forming an electroforming metal layer with a plurality of through holes. The electroforming metal layer is then detached from the substrate along with the metal layer so as to obtain the converting component 32.

The manufactured converting component 32 preferably has a thickness ranging from 20 μm to 300 μm, and each of the orifices 320 has a hole diameter ranging from 5 μm to 1000 μm. Adjacent ones of the orifices 320 of the converting component 32 are spaced apart by a distance, ranging from 5 μm to 2000 μm, preferably ranging from 10 μm to 200 μm or alternatively ranging from 5 μm to 500 μm so as to achieve better conversion effect. Each of the orifices 320 has an inlet opening 321 that is in fluid communication with the coolant chamber 312 and an outlet opening 322 that is in fluid communication with the vaporization chamber 321. Both the diameters of the inlet opening 321 and the outlet opening 322 may vary according to requirement, and the diameter of the inlet opening 321 is preferably larger than the diameter of the outlet opening 322.

Referring back to FIG. 2, the vapor conduit 4 is made of a material, such as polymer material or stainless steel, that is compatible with the liquid coolant, and has an inner surface formed with a micro structure so as to increase the surface area of the inner surface of the vapor conduit 4, thereby allowing for a portion of the coolant vapor to condense thereon.

The coolant transferring module 5 further includes a pump 52 for driving flow of the liquid coolant into the coolant chamber 312 and flow of the coolant vapor from the vapor conduit 4 into the condenser 6, and a valve 53 for controlling the flow rata of the liquid coolant. The pump 52 can be configured to be a piezoelectric film type, a gear wheel type or an electromagnetic type, and is made of a material that is compatible with the liquid coolant. It is worth noting that, if the pump 52 is capable of controlling the flow rate of the liquid coolant, the valve 53 may be omitted.

Referring back to FIG. 1, the condenser 6 includes a hollow storage chamber 61 and a plurality of hollow fins 62. The storage chamber 61 and inner spaces in the fins 62 are fluidly connected, and cooperatively form a condensing chamber 602 to which the fluid inlet 601 and the fluid outlet 603 are connected fluidly. After the vapor coolant enters the condensing chamber 602, heat exchange between the vapor coolant and the inner surface of the condensing chamber 602 occurs, thereby condensing the vapor coolant to liquid form. Each of the storage chamber 61 and an inner surface of each of the fins 62 is formed with a micro structure, cooperating with the hollow configuration of the fins 62 to increase the surface area of the condensing chamber 602, thereby yielding higher condensing efficiency.

In particular, a bottom surface of the storage chamber 61 can be designed to be slightly tilted, such that the fluid inlet 601 is located higher than the fluid outlet 603. This configuration helps flow of the condensed liquid coolant from the fluid outlet 603 into the coolant conduit 51.

In the first preferred embodiment, the condenser 6 further includes a condenser temperature sensor 63 and a condenser pressure sensor 64 for monitoring the temperature and pressure of the condensing chamber 602, respectively. The power module 7 supplies the power needed to operate the pump 52 and the valve 53, and is connected to the condenser temperature sensor 63 and the condenser pressure sensor 64 of the condenser 6, and the temperature sensor 33 of the cooling module 3. The rotational speed of the pump 52 and the flow regulation of the valve 53 are controlled by the power module 7 based on the data from the connected sensors.

Referring to FIG. 4, the liquid coolant that enters the coolant chamber 312 is forced to pass through the orifices 320 of the converting component 32, such that the liquid coolant is converted into plumes of micro droplets. The liquid coolant droplets then travel toward the interior surface of the thermal-transmittance wall 310, and absorb the heat generated by the heat source 10 and transmitted from the heat source 10 to the interior surface through the exterior surface of the thermal-transmittance wall 310, thereby resulting in formation of the coolant vapor and at least one bubble 9 on the interior surface that stores the coolant vapor. Subsequent liquid coolant droplets that reach the interior surface of the thermal-transmittance wall 310 can pop the bubble 9, thereby increasing the pressure of the vaporization chamber 311 and making the coolant vapor flow out of the vaporization chamber 311 via the vapor outlet 313. It is important to note that, with the aforesaid angle ($\alpha$) makes the distance ($d_1$) not greater then the distance ($d_2$), the liquid coolant droplets entering the vaporization chamber 311 through the orifices 320 that are in the vicinity of the top edge 323 are able to reach the interior surface of the thermal-transmittance wall 310 sooner due to the shorter distance travelled thereby so as to minimize the adverse affect of gravity pull. The uneven heat dissipating effect drawback can be thus overcome.

Figure 7:
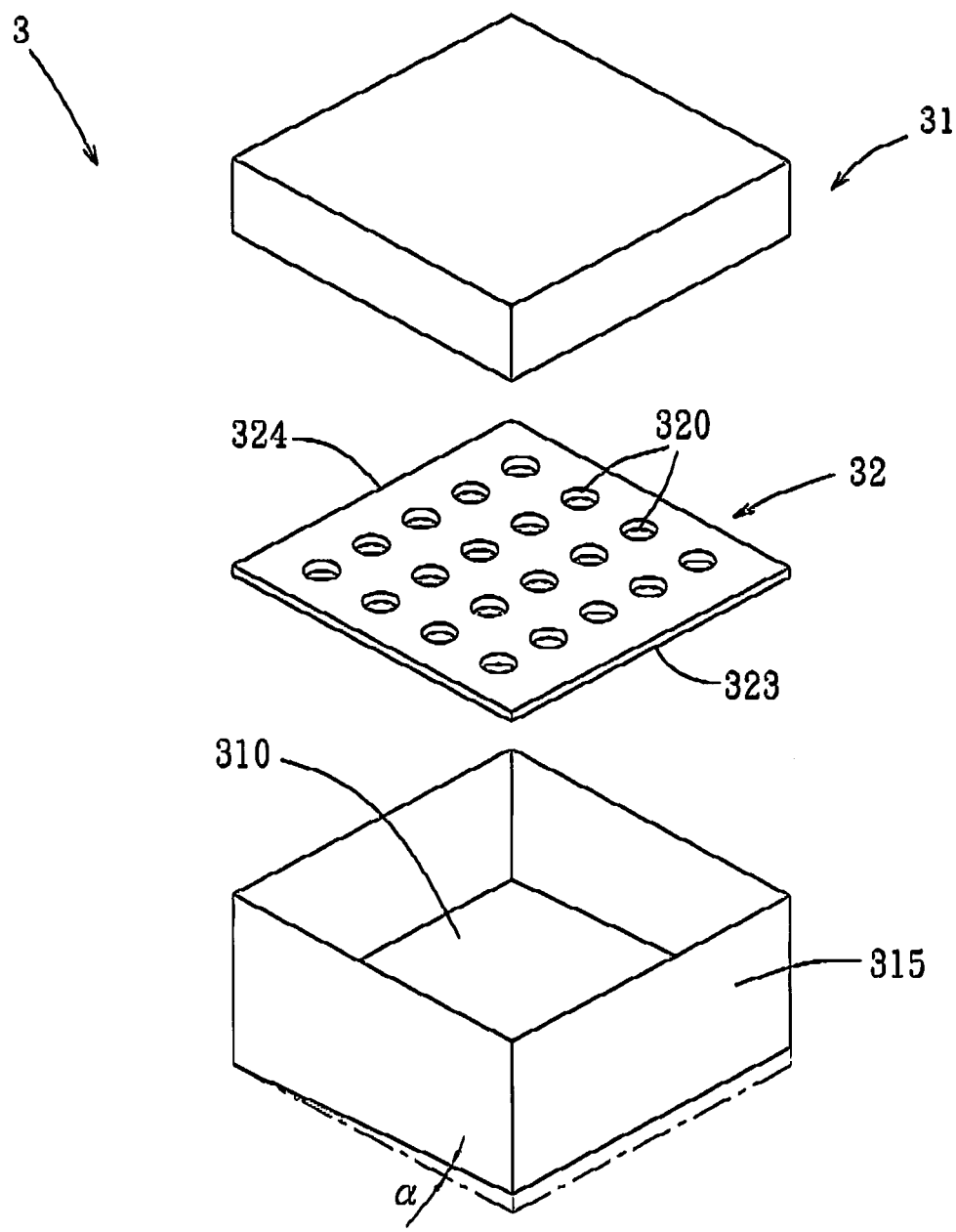
FIG. 7 is an exploded perspective view of a casing and a converting component of a second preferred embodiment of a lamp device according to the invention.
Figure 8:
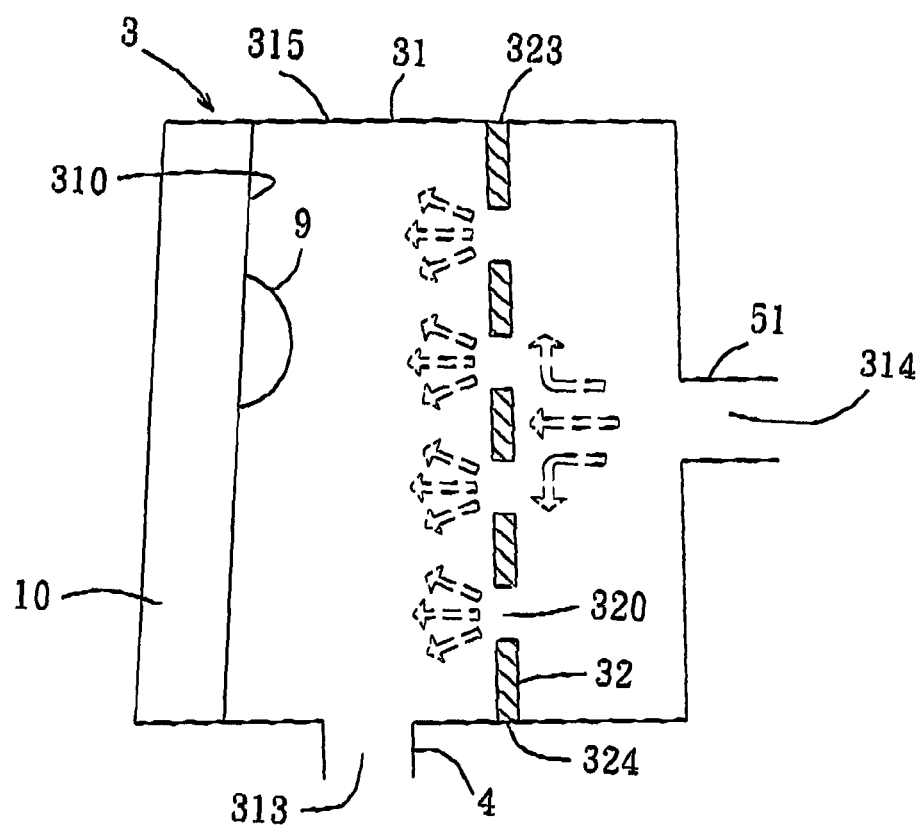
FIG. 8 is a schematic view illustrating the liquid coolant entering a cooling module and exchanging heat with a thermal-transmittance wall according to the second preferred embodiment.

As shown in FIGS. 7 and 8, the second preferred embodiment of the lamp device 100 according to the present invention has a structure similar to that of the first embodiment. The main difference between this embodiment and the previous embodiment resides in the configuration of the casing 31 of the cooling module 3. In the second embodiment, the first casing part 315 has an open side defined by an edge. The exterior surface of the thermal-transmittance wall 310 is disposed on an inclined plane. The inclined plane forms the angle ($\alpha$) with a plane of the edge of the open side of the first casing part 315. The converting component is disposed at the edge of the open side of the first casing part 315. The second preferred embodiment has the same advantages as those of the first preferred embodiment.

To sum up, by virtue of the specific configuration of the converting component 32, the liquid coolant can be converted into plumes of the liquid coolant that travel toward the interior surface of the thermal-transmittance wall 310. Moreover, the angle ($\alpha$) that is formed by the converting component 32 relative to the plane of the thermal-transmittance wall 310 makes the distance ($d_1$) shorter than the distance ($d_2$), thus overcoming the uneven heat dissipating effect drawback.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A cooling module for use with a liquid coolant to cool a heat source, said cooling module comprising:
   a casing having a thermal-transmittance wall, a coolant inlet and a vapor outlet, said thermal-transmittance wall having an interior surface and an exterior surface to be disposed in heat conductive contact with the heat source; and
   a converting component disposed in said casing and dividing an interior of said casing into a coolant chamber and a vaporization chamber, said coolant chamber being in fluid communication with said coolant inlet for receiving the liquid coolant therein, said vaporization chamber being adjacent to said thermal-transmittance wall and being in fluid communication with said vapor outlet, said converting component being formed with a plurality of orifices for permitting the liquid coolant in said coolant chamber to be ejected therethrough to form plumes of the liquid coolant that travel toward said interior surface of said thermal-transmittance wall and that exchange heat with said thermal-transmittance wall to result in coolant vapor flowing out of said vaporization chamber via said vapor outlet.

2. The cooling module as claimed in claim 1, wherein said converting component has a thickness ranging from 20 μm to 300 μm, said orifices have a hole diameter ranging from 5 μm to 1000 μm, and adjacent ones of said orifices are spaced apart by a distance ranging from 5 μm to 2000 μm.

3. The cooling module as claimed in claim 1, wherein said converting component has a top edge and a bottom edge, and forms an angle relative to said thermal-transmittance wall such that a distance between said top edge of said converting component and said interior surface of said thermal-transmittance wall is shorter than a distance between said bottom edge of said converting component and said interior surface of said thermal-transmittance wall.

4. The cooling module as claimed in claim 3, wherein said casing includes a first casing part, said thermal-transmittance wall forming a closed side of said first casing part, said first casing part having an open side defined by an edge that is disposed on an inclined plane, the inclined plane forming the angle with a plane of said thermal-transmittance wall, said converting component being disposed at said edge of said open side of said first casing part.

5. The cooling module as claimed in claim 3, wherein said casing includes a first casing part, said thermal-transmittance wall forming a closed side of said first casing part, said first casing part having an open side defined by an edge, said exterior surface of said thermal-transmittance wall being disposed on an inclined plane, the inclined plane forming the angle with a plane of said edge of said open side of said first casing part, said converting component being disposed at said edge of said open side of said first casing part.

6. The cooling module as claimed in claim 3, wherein the angle is greater than 0 degree and not greater than 10 degrees.

7. A cooling system for use with a liquid coolant to cool a heat source, said cooling system comprising:
a cooling module including
a casing having a thermal-transmittance wall, a coolant inlet and a vapor outlet, said thermal-transmittance wall having an interior surface and an exterior surface to be disposed in heat conductive contact with the heat source, and
a converting component disposed in said casing and dividing an interior of said casing into a coolant chamber and a vaporization chamber, said coolant chamber being in fluid communication with said coolant inlet for receiving the liquid coolant therein, said vaporization chamber being adjacent to said thermal-transmittance wall and being in fluid communication with said vapor outlet, said converting component being formed with a plurality of orifices for permitting the liquid coolant in said coolant chamber to be ejected therethrough to form plumes of the liquid coolant that travel toward said interior surface of said thermal-transmittance wall and that exchange heat with said thermal-transmittance wall to result in coolant vapor flowing out of said vaporization chamber via said vapor outlet;
a condenser having a fluid inlet and a fluid outlet;
a vapor conduit connecting fluidly said vapor outlet to said fluid inlet to permit flow of the coolant vapor from said vaporization chamber to said condenser; and
a coolant conduit connecting fluidly said fluid outlet and said coolant inlet to permit flow of the liquid coolant in said condenser to said coolant chamber;
wherein said cooling module, said condenser, said vapor conduit and said coolant conduit cooperate to form a closed circulation loop.

8. The cooling system as claimed in claim 7, wherein said converting component has a thickness ranging from 20 μm to 300 μm, said orifices have a hole diameter ranging from 5 μm to 1000 μm, and adjacent ones of said orifices are spaced apart by a distance ranging from 5 μm to 2000 μm.

9. The cooling system as claimed in claim 7, wherein said coolant conduit includes a pump for driving flow of the liquid coolant into said coolant chamber.

10. The cooling system as claimed in claim 7, wherein said converting component has a top edge and a bottom edge, and forms an angle relative to said thermal-transmittance wall such that a distance between said top edge of said converting component and said interior surface of said thermal-transmittance wall is shorter than a distance between said bottom edge of said converting component and said interior surface of said thermal-transmittance wall.

11. The cooling system as claimed in claim 10, wherein said casing includes a first casing part, said thermal-transmittance wall forming a closed side of said first casing part, said first casing part having an open side defined by an edge that is disposed on an inclined plane, the inclined plane forming the angle with a plane of said thermal-transmittance wall, said converting component being disposed at said edge of said open side of said first casing part.

12. The cooling system as claimed in claim 10, wherein said casing includes a first casing part, said thermal-transmittance wall forming a closed side of said first casing part, said first casing part having an open side defined by an edge, said exterior surface of said thermal-transmittance wall being disposed on an inclined plane, the inclined plane forming the angle with a plane of said edge of said open side of said first casing part, said converting component being disposed at said edge of said open side of said first casing part.

13. The cooling system as claimed in claim 10, wherein the angle is greater than 0 degree and not greater than 10 degrees.

14. A lamp device comprising:
a lamp housing;
a light emitting component disposed in said lamp housing and serving as a heat source; and
a cooling system disposed in said lamp housing for cooling said light emitting component, said cooling system including
a liquid coolant;
a cooling module including
a casing having a thermal-transmittance wall, a coolant inlet and a vapor outlet, said thermal-transmittance wall having an interior surface and an exterior surface disposed in heat conductive contact with the heat source, and
a converting component disposed in said casing and dividing an interior of said casing into a coolant chamber and a vaporization chamber, said coolant chamber being in fluid communication with said coolant inlet for receiving the liquid coolant therein, said vaporization chamber being adjacent to said thermal-transmittance wall and being in fluid communication with said vapor outlet, said converting component being formed with a plurality of orifices for permitting the liquid coolant in said coolant chamber to be ejected therethrough to form plumes of the liquid coolant that travel toward said interior surface of said thermal-transmittance wall and that exchange heat with said thermal-transmittance wall to result in coolant vapor flowing out of said vaporization chamber via said vapor outlet;

a condenser having a fluid inlet and a fluid outlet;

a vapor conduit connecting fluidly said vapor outlet to said fluid inlet to permit flow of the coolant vapor from said vaporization chamber to said condenser; and a coolant conduit connecting fluidly said fluid outlet to said coolant inlet to permit flow of the liquid coolant in said condenser to said coolant chamber;

wherein said cooling module, said condenser, said vapor conduit and said coolant conduit cooperate to form a closed circulation loop.

15. The lamp device as claimed in claim 14, wherein said coolant conduit includes a pump for driving flow of the liquid coolant into said coolant chamber.

16. The lamp device as claimed in claim 14, wherein said light emitting component is disposed at an angle greater than 0 degree and not greater than 90 degrees with respect to a horizontal plane.

17. The lamp device as claimed in claim 16, wherein the angle is not smaller than 10 degrees and not greater than 60 degrees.

18. The lamp device as claimed in claim 14, wherein said converting component has a top edge and a bottom edge, and forms an angle relative to said thermal-transmittance wall such that a distance between said top edge of said converting component and said interior surface of said thermal-transmittance wall is shorter than a distance between said bottom edge of said converting component and said interior surface of said thermal-transmittance wall.

19. The lamp device as claimed in claim 18, wherein the angle is greater than 0 degree and not greater than 10 degrees.

* * * * *